(12) United States Patent
Markovich et al.

(10) Patent No.: US 6,492,715 B1
(45) Date of Patent: Dec. 10, 2002

(54) INTEGRATED SEMICONDUCTOR PACKAGE

(75) Inventors: Voya R. Markovich, Endwell, NY (US); Douglas O. Powell, Endicott, NY (US); Amit K. Sarkhel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/660,866

(22) Filed: Sep. 13, 2000

(51) Int. Cl.⁷ ............................................. H01L 23/02

(52) U.S. Cl. ..................... 257/678; 257/686; 257/669; 257/783; 257/700

(58) Field of Search ............................... 257/778, 780, 257/729, 686, 696, 738, 678, 693, 669, 783, 668, 688, 705, 700, 695

(56) References Cited

U.S. PATENT DOCUMENTS

| | | | |
|---|---|---|---|
| 4,752,027 A | | 6/1988 | Gschwend |
| 4,925,723 A | | 5/1990 | Bujatti et al. |
| 5,067,007 A | * | 11/1991 | Kanji et al. ................. 257/780 |

(List continued on next page.)

FOREIGN PATENT DOCUMENTS

| | | |
|---|---|---|
| JP | 05029390 A | 2/1993 |
| JP | 06291165 A | 10/1994 |
| JP | 07249732 A | 10/1994 |
| JP | 09064236 A | 7/1997 |
| JP | 11008334 A | 1/1999 |
| JP | 11049595 A | 2/1999 |
| JP | 11265967 A | 9/1999 |

OTHER PUBLICATIONS

S.W. Anderson, F.E. Andros, A.C. Bhatt, P.A.Chalco, S.K. Kang and C.J. Sambucetti, *IBM Technical Disclosure Bulletin*, vol. 40, No. 2, Feb. 1997.

G.A. Huston, P.D. Isaacs, G.A. Knotts and M. Swain, *IBM Technical Disclosure Bulletin*, vol. 37 No. 11, Nov. 1994.

*Primary Examiner*—David Nelms
*Assistant Examiner*—Andy Huynh
(74) *Attorney, Agent, or Firm*—George R. McGuire; Hancock & Estabrook, LLP

(57) ABSTRACT

The present invention provides an integrated semiconductor module comprising a chip, interposer, and substrate. The module is adapted to be mounted on a traditional circuit card carrying multiple other components. The chip of the present invention can be a conventional IC chip or chip package, including ball grid array packages, and will simply be referred to hereinafter as a "chip." The interposer of the present invention is a conventional thin film interposer, such as those composed of a polyimide material and fabricated on a glass carrier plate. The substrate of the present invention is a conventional circuitized substrate, such as a BGA or laminate substrate, that is commonly employed in carrying a chip on a circuit card. In its assembled state, the present invention comprises an interposer mounted on top of a substrate with the electrical contacts formed on the lower surface of the interposer positioned in electrical communication with respective ones of electrical contacts formed on the upper surface of the substrate. A non-conductive material, such as an epoxy resin, fills the voids between the interposer and substrate created by the electrical connections. The epoxy resin forms a mechanical bond between the interposer and substrate, thereby enhancing the structural integrity of the unit. Moreover, by filling the voids between the electrical connections, essentially no foreign particles can become entrapped therein and cause electrical malfunctions. Accordingly, the environmental and operational integrity of the unit is also enhanced.

9 Claims, 3 Drawing Sheets

U.S. PATENT DOCUMENTS

| | | |
|---|---|---|
| 5,211,805 A | 5/1993 | Srinivasan |
| 5,468,681 A | 11/1995 | Pasch |
| 5,525,204 A | 6/1996 | Shurboff et al. |
| 5,534,466 A | 7/1996 | Perfecto et al. |
| 5,576,519 A | 11/1996 | Swamy |
| 5,598,036 A * | 1/1997 | Ho ............................. 257/738 |
| 5,759,047 A | 6/1998 | Brodsky et al. |
| 5,843,811 A | 12/1998 | Singh et al. |
| 5,863,815 A | 1/1999 | Egawa |
| 5,912,507 A * | 6/1999 | Dunn et al. .................. 257/767 |
| 5,918,113 A | 6/1999 | Higashi et al. |
| 5,962,925 A | 10/1999 | Eifuku et al. |
| 6,002,168 A * | 12/1999 | Bellaar et al. ............... 257/778 |
| 6,075,710 A * | 6/2000 | Lau ............................. 257/778 |
| 6,137,164 A * | 10/2000 | Yew et al. .................. 257/686 |

\* cited by examiner

INTEGRATED SEMICONDUCTOR PACKAGE

BACKGROUND OF THE INVENTION

1. Field of Invention

The present invention relates generally to integrated semiconductor packages comprising a chip, interposer, and substrate, and more particularly to improvements to the structural and environmental integrity thereof.

2. Description of Prior Art

Semiconductor devices and other electronic components, such as chip carriers, have been mounted to circuitized substrates, such as printed circuit boards, using a variety of methods, including conductive pins, solder balls (commonly referred to as bumps), wirebonds, and the like. In certain applications, an IC chip is mounted directly to the substrate through the aforementioned mounting methods. However, in applications requiring high wiring density it is common to employ an interconnect member between the IC chip and the substrate in order to cost effectively increase the number of I/Os the device is capable of handling. These interconnect members are commonly referred to as interposers.

Chip packages used in high density applications are well known. A common example of such a package is what is referred to in the art as "ball grid array" packages ("BGAs"). These types of packages include an IC chip having a lower surface on which is mounted an array of electrical contacts, commonly in the form of solder bumps, which serve as the I/O leads. These solder bumps must be electrically connected to pads positioned on the upper surface of the substrate, but due to the small spaces between contacts, wiring the substrate to accommodate all the solder bumps is cost prohibitive. Moreover, such connections are not structurally sound due to the thermal expansion characteristics of the substrate and chip structures which cause deflections in the members and consequently, breaks in the electrical connections.

To remedy the drawbacks of directly connecting the IC chip to the substrate, an interposer having a hierarchy of wiring densities is commonly employed. The interposer is commonly composed of a thin film, such as polyimide. Single and multiple layer thin film interposers are well known in the art. One known method for manufacturing multiple layer thin film interposers is by dispersing a first layer of polyimide on a carrier plate, typically composed of glass, forming vias, or micro-holes through this polyamide dielectric layer in a predetermined patterns, and then depositing copper or other conductive wire leads thereon by sputtering, plating, or other known methods. A second layer (and subsequent layers) of polyimide is then built upon the preceding dielectric layer. Vias are then formed through the dielectric layer, and conductive wires are formed thereon. The manufacturing of these types of thin film interposers is well known in the art. The interposer is then positioned on the substrate with the conductive pads on the interposer being in electrical communication with corresponding ones of the pads formed on the substrate. A process, such as reflow soldering, or the like, may then be employed to melt the solder and form an electrical bond at the conductive pads between the interposer and substrate. The glass carrier plate is then removed from the top surface of the interposer through a known process, such as a laser ablation process as described in the present assignee's prior U.S. Pat. No. 5,258,236. The IC chip (which may be in the form of a BGA) is then positioned on the upper surface of the interposer with its I/O contacts in electrical communication with the conductive pads formed on the upper surface of the interposer. A heating process is then employed to melt the solder and form a bond between the electrical contacts on the chip and interposer.

Manufacturing a module comprising a single chip, interposer and substrate can be readily modified to include mounting multiple chips on a single interposer, or multiple interposers on a single substrate.

3. Objects and Advantages

It is a principal object and advantage of the present invention to provide an electronic package or module comprising a chip, interposer, and substrate that is structurally and environmentally sound.

It is an additional object and advantage of the present invention to provide an electronic package or module that is cost effectively manufactured.

It is a further object and advantage of the present invention to provide an electronic package or module that can effectively handle an increased number of I/Os per unit area.

Other objects and advantages of the present invention will in part be obvious, and in part appear hereinafter.

SUMMARY OF THE INVENTION

In accordance with the foregoing objects and advantages, the present invention provides an integrated semiconductor module comprising a chip, interposer, and substrate. The module is adapted to be mounted on a traditional circuit card carrying multiple other components.

The chip of the present invention can be a conventional IC chip or chip package, including ball grid array packages, and will simply be referred to hereinafter as a "chip." The interposer of the present invention is a conventional thin film interposer, such as those composed of a polyimide material and fabricated on a glass carrier plate. The substrate of the present invention is a conventional circuitized substrate, such as a BGA or laminate substrate, that is commonly employed in carrying a chip on a circuit card.

In its assembled state, the present invention comprises an interposer mounted on top of a substrate with the electrical contacts formed on the lower surface of the interposer positioned in electrical communication with respective ones of electrical contacts formed on the upper surface of the substrate. A non-conductive material, such as an epoxy resin, fills the voids between the interposer and substrate created by the electrical connections. The epoxy resin forms a mechanical bond between the interposer and substrate, thereby enhancing the structural integrity of the unit. Moreover, by filling the voids between the electrical connections, essentially no foreign particles can become entrapped therein and cause electrical malfunctions. Accordingly, the environmental and operational integrity of the unit is also enhanced.

A chip is mounted to the upper surface of the interposer with its I/O connectors (in the form of solder balls, wire leads, etc . . . ) positioned in electrical communication with the electrical contacts formed on the upper surface of the interposer. A non-conductive material, such as an epoxy resin, fills the voids created between the interposer and chip by the electrical contacts, thereby enhancing the structural and environmental integrity of the unit.

BRIEF DESCRIPTION OF THE DRAWINGS

The present invention will be more fully understood when reading the following Detailed Description in conjunction with the accompanying drawing figures in which.

DETAILED DESCRIPTION

Figure 1:
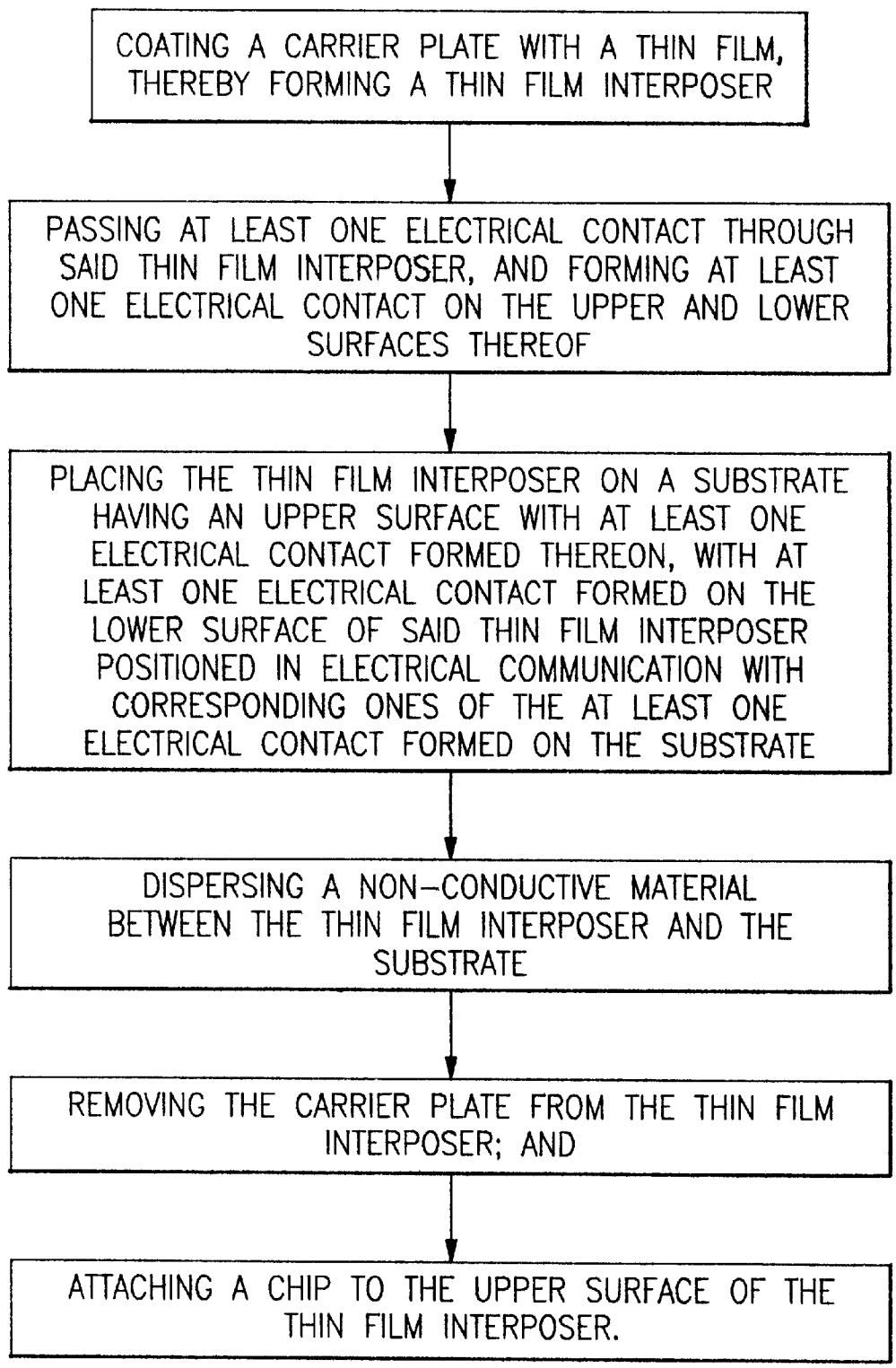
FIG. 1 is a flow chart illustrating the method for manufacturing the present invention.
Figure 2A:
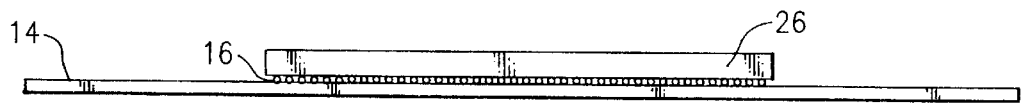
FIGS. 2a–2f are sequential, cross-sectional views illustrating the present invention at different points in the manufacturing process.
Figure 2B:
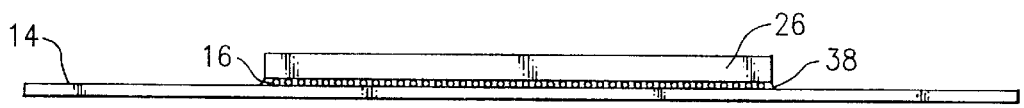
Figure 2C:
Figure 2D:
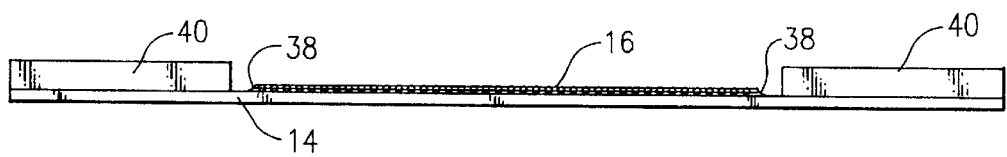
Figure 2E:
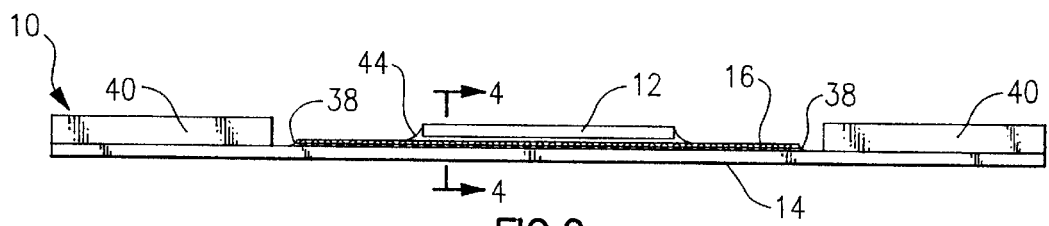
Figure 2F:
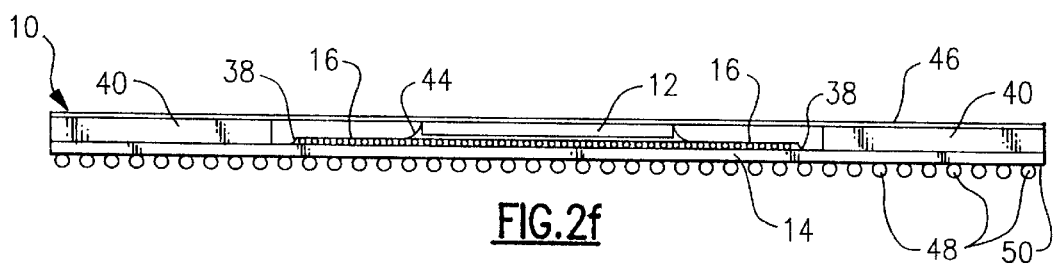
Figure 3:
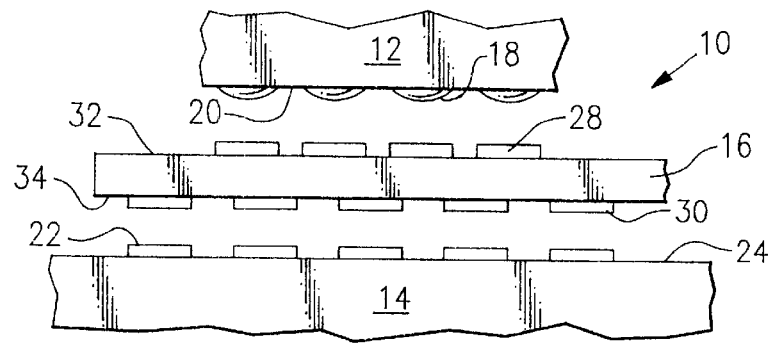
FIG. 3 is an enlarged, exploded, cross-sectional view of the principal components of the present invention prior to their assembly.
Figure 4:
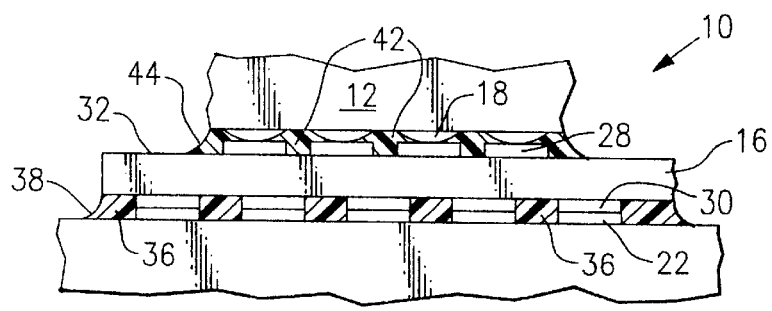
FIG. 4 is an enlarged, cross-sectional view taken along line 4—4 of FIG. 2e.
Figure 5:
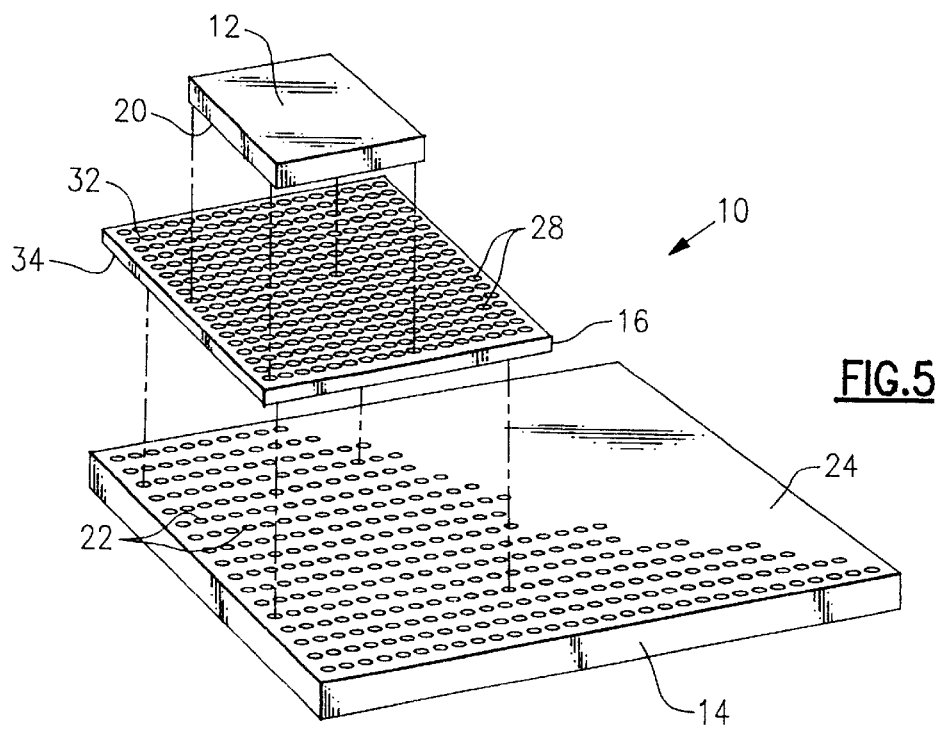
FIG. 5 is an exploded perspective of the principal components of the present invention.

Referring now to the drawings in which like reference numerals refer to like parts throughout, there is seen in FIGS. 2–4 an electronic package designated generally by reference numeral 10. Package 10 generally comprises an IC chip 12, a circuitized substrate 14, and an interposer 16 interconnecting chip 12 and substrate 14.

Chip 12 can be any conventional type of semiconductor device, such as a pin grid array or a ball grid array ("BGA"), having at least one electrical contact 18 formed on its lower surface 20. In a BGA type package, chip 12 will include a plurality of contacts 18 arranged in an array on its lower surface. Contacts 18 serve as the input/output ("I/O") points for chip 12, and are composed of a conductive material, and coated with a solder typically formed in the shape of a ball.

Substrate 14 may be a conventional ball grid array, single layer ceramic laminate, or other common substrate, and is supplied with a series of circuits operably positioned therein, and at least one electrical contact 22 formed on its upper surface 24. Substrate 14 will also contain other electrical contacts, most often formed on its lower surface, which provide electrical connection points to a circuit card. The contacts 22 may be flattened to provide a stable surface on which to mount the contacts from interposer 16, as will be described further hereinafter.

Interposer 16 is composed of at least one layer of thin film, preferably a polyimide, that is fabricated on a carrier plate 26, preferably composed of glass. In fabricating interposer 16, a first layer of thin film is dispersed on carrier plate 26 by spin coating, spraying, or other equivalent process. A plurality of vias, or micro-holes, are then formed through this dielectric layer. Copper, or other conductive material, is then dispersed on the layer of thin film and patterned into circuitry through sputtering, plating, etching, or other known process. A second, and subsequent, layer of thin film is then dispersed upon the previous layer and circuitized with vias formed through each dielectric layer. Interposer 16 may comprise one or more layers of material. Conductive members interconnecting the various layers of dielectric form an array of contacts 28, 30 on the upper and lower surfaces, 32, 34, respectively, of interposer 16. The contacts 28 are generally spaced closer together than contacts 30 (the spacing ratio generally being in the range of 1.5×–4.0×), although they may be equally spaced. Solder bumps (not identified separately from the contacts) may be applied to surface contacts 28, 30 in order to provide a bonding agent for connecting to substrate 14 and chip 12. The solder may be attached in any conventional manner, such as paste stenciling, solder reflow or solder injection processes. It should be noted that it is necessary for solder to be applied only to contacts 28, 30, or to substrate contacts 22 and/or chip contacts 18, although solder may be applied to all of the contacts. Interposer 16 may be manufactured pursuant to the teachings of U.S. Pat. No. 5,534,466, incorporated herein by reference, owned by the assignee of the instant invention.

Referring to FIGS. 1 and 2a–2f, package 10 is manufactured by first placing the lower surface 34 of interposer 16, together with carrier plate 26 on which it has been fabricated, onto upper surface 24 of substrate 14 with contacts 30 engaging contacts 22. Interposer 16 and substrate 14 are then subjected to a heating process to melt the solder on the electrical contacts 30 and 22, thereby forming an electrical bond between substrate 14 and interposer 16. A non-conductive material 36, preferably a liquid epoxy resin, is then injected between substrate 14 and interposer 16 until the capillary action causes the material to fill all the voids between the electrical connections. Material 36 may be injected along one edge of interposer 16, or along adjacent edges thereof, and is dispersed until a fillet 38 is formed around the entire periphery of interposer 16, thereby ensuring essentially complete under filling of interposer 16 with material 36. Material 36 is then permitted to cure, thereby hardening and forming a mechanical bond between interposer 16 and substrate 14. In addition to the improved structural integrity of the unit, material 36 improves the environmental integrity as well by prohibiting dust and other foreign contaminants from entering between the two elements. Interposer 16 may then be to a cleaning process, such as plasma cleaning, to remove organic residues from the exposed surfaces thereof.

Continuing with the manufacturing process, a stiffener 40 (typically in the form or a square ring surrounding interposer 16) may then be attached to substrate 14 on opposing sides of interposer 16. Stiffener 40 adds rigidity to substrate 14 to prevent it from deflecting during the heating processes. There may be instances where a stiffener is not necessary, and it is unimportant exactly when in the process a stiffener is added.

The next step in the manufacturing process is to remove carrier plate 26 from interposer 16. Carrier plate 26 may be removed through any known process such as, for example, chemical ablation, thermal release, or laser ablation. Laser ablation is the preferred method of removal, and such a process is explained in the present assignee's U.S. Pat. No. 5,258,236, which is incorporated herein by reference.

The next step in the process is to attach chip 12 to interposer 16. The lower surface 20 of chip 12 is placed on the upper surface 32 of interposer 16 with contacts 18 engaging corresponding ones of contacts 28. Interposer 16 and chip 12 are then subjected to a conventional process, such as reflow soldering, or the like, causing the solder in the contacts to melt and fuse together, thereby forming an electrical bond between the two members. A non-conductive, liquid material 42, such as an epoxy resin, is then dispersed along one or adjacent edges of chip 16 and forced between interposer 16 and chip 12. Through capillary action, the liquid fills the voids between the contacts 18, 28, and to ensure essentially complete under filling of chip 12, a fillet 44 of material 42 is formed along the peripheral edges of chip 12. Material 42 is then permitted to cure, thereby hardening and creating a mechanical bond between chip 12 and interposer 16. In addition to improving the structural integrity of the chip/interposer structure, it also improves the environmental integrity thereof.

By under filling chip 12 and interposer 16 in the manner described hereinabove, thereby improving the structural rigidity of package 10, it is less likely that the electrical connections formed between chip 12 and interposer 16 and interposer 16 and substrate 14 will break. Moreover, the placement of the electrical connections between chip 12 and interposer 16 and interposer 16 and substrate 14 is less important; thus, electrical contacts 28, 30 may be vertically aligned along a common longitudinal axis, or they may be laterally staggered, without a problem of breakage between the contacts occurring due to thermal expansion or other structural problems that may occur to the underlying materials.

In addition, material 36, 42 includes a low viscosity that permits it to flow between the contacts formed on interposer 16, chip 12, and substrate 14; a thermal coefficient of expansion generally in a preferred range of 20–35 ppm/degree Celsius to permit it to withstand the heating processes; and an elastic modulus preferably in the range of (0.250–2)×106 PSI. Filled epoxy resin (or other thermo setting resin) includes these characteristics, and is therefore a preferred under fill material (the fillers are low expansion, electrically insulating particles, with silicon dioxide (silica) being the most common). Pure epoxy resin includes a coefficient of thermal expansion of about 50–70 ppm/degree Celsius, but may also be used as an under fill material.

It should be noted that contacts 18 on chip 12 are generally in the form of rounded solder balls. In order to ensure a secure connection between contacts 18 and 28, contacts 28 may be flattened prior to attaching chip 12 to interposer 16. By flattening contacts 28, the rounded shape of contacts 18 are less likely to slip or slide off of contacts 28, than if contacts 28 were also rounded in shape.

To complete package 10, a plate 46 may be positioned in covering relation to chip 12, interposer 16, and substrate 14, thereby enclosing the components of package 10 between plate 46 and substrate 14. Plate 46 is positioned in contacting relation to the upper surfaces of chip 12 and stiffeners 38, 40, and in a plane that is essentially parallel to and vertically spaced from substrate 14. Plate 46 may be composed of copper with or without a coating on its upper surface of another metal, such as nickel, and include a heat sink incorporated into its upper surface.

As a final step in completing the manufacture of package 10, solder balls 48, or other electrical contacts, are formed on the lower surface 50 of substrate 14. Contacts 48 will ultimately be connected to the electrical contacts on a larger circuit card for incorporation into an electrical device, such as a computer, recording device, or the like.

What is claimed is:

1. An electronic package, comprising:

a. a substrate having an upper surface with at least one electrical contact formed thereon;

b. a thin film interposer having a lower surface with at least one electrical contact formed thereon and positioned in electrical communication with corresponding ones of said at least one electrical contact formed on said substrate, and an upper surface having at least one electrical contact formed thereon; and c. a filled epoxy material positioned between and mechanically bonding said lower surface of said thin film interposer and said upper surface of said substrate and between said electrical contacts formed on said thin film interposer and said substrate.

2. The electronic package of claim 1, further comprising an IC chip having a lower surface with at least one electrical contact formed thereon that are positioned in electrical communication with corresponding ones of said at least one electrical contact formed on said upper surface of said thin film interposer.

3. The electronic package of claim 2, further comprising at least one stiffener member attached to said substrate and positioned adjacent said thin film interposer and chip.

4. The electronic package of claim 2, further comprising a non-conductive material positioned between and mechanically bonding said upper surface of said thin film interposer and said lower surface of said chip and between said electrical contacts formed on said upper surface of said thin film interposer and said lower surface of said chip.

5. The electronic package of claim 4, wherein said non-conductive material is a filled epoxy resin.

6. The electronic package of claim 4, further comprising a plate positioned in covering relation to said chip, thin film interposer, and substrate, and extending in a plane that is parallel to and vertically spaced from said substrate.

7. The electronic package of claim 6, wherein said plate is composed of copper.

8. The electronic package of claim 7, wherein said plate is composed of copper coated with another metal.

9. The electronic package of claim 6, wherein said plate includes a heat sink incorporated therein.

* * * * *